(12) United States Patent
Mazur et al.

(10) Patent No.: US 9,372,392 B2
(45) Date of Patent: Jun. 21, 2016

(54) RETICLES FOR USE IN FORMING IMPLANT MASKING LAYERS AND METHODS OF FORMING IMPLANT MASKING LAYERS

(71) Applicant: GLOBALFOUNDRIES Inc., Grand Cayman (KY)

(72) Inventors: Martin Mazur, Pulsnitz (DE); Dietmar Henke, Radebeul (DE); Hans-Juergen Thees, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 192 days.

(21) Appl. No.: 14/325,515

(22) Filed: Jul. 8, 2014

(65) Prior Publication Data

US 2014/0329173 A1   Nov. 6, 2014

Related U.S. Application Data

(62) Division of application No. 13/560,012, filed on Jul. 27, 2012, now Pat. No. 8,802,360.

(51) Int. Cl.
*G03F 1/22* (2012.01)
*G03F 1/24* (2012.01)
*G03F 7/20* (2006.01)
*G03F 1/00* (2012.01)

(52) U.S. Cl.
CPC .. *G03F 1/24* (2013.01); *G03F 1/22* (2013.01); *G03F 7/2045* (2013.01); *G03F 1/00* (2013.01)

(58) Field of Classification Search
CPC ............ G03F 1/22; G03F 1/24; G03F 7/2045
USPC ............................................................ 430/5
See application file for complete search history.

(56) References Cited

U.S. PATENT DOCUMENTS

| 8,273,523 B2 * | 9/2012 | Detweiler ........... G03F 7/70425 430/313 |
| 2008/0160779 A1 | 7/2008 | Detweiler et al. |

* cited by examiner

*Primary Examiner* — Christopher Young
(74) *Attorney, Agent, or Firm* — Amerson Law Firm, PLLC

(57) ABSTRACT

In one example, a reticle disclosed herein includes a body having a center, an arrangement of a plurality of exposure patterns, wherein a center of the arrangement is offset from the center of the body, and at least one open feature defined on or through the body of the reticle. In another example, a method is disclosed that includes forming a layer of photoresist above a plurality of functional die and a plurality of incomplete die, exposing the photoresist material positioned above at least one of the functional die and/or at least one of the incomplete die, performing an incomplete die exposure processes via an open feature of the reticle to expose substantially all of the photoresist material positioned above the plurality of incomplete die, and developing the photoresist to remove the portions of the photoresist material positioned above the incomplete die.

20 Claims, 5 Drawing Sheets

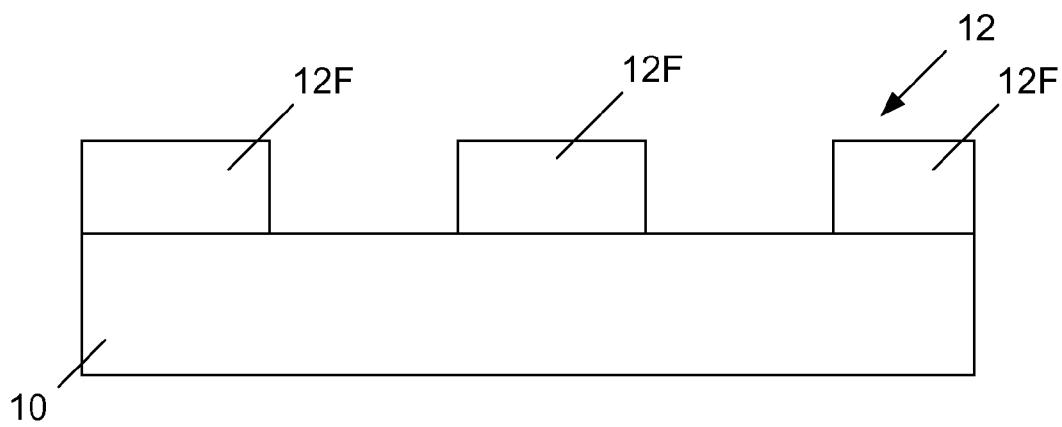
(Prior Art) Figure 1A
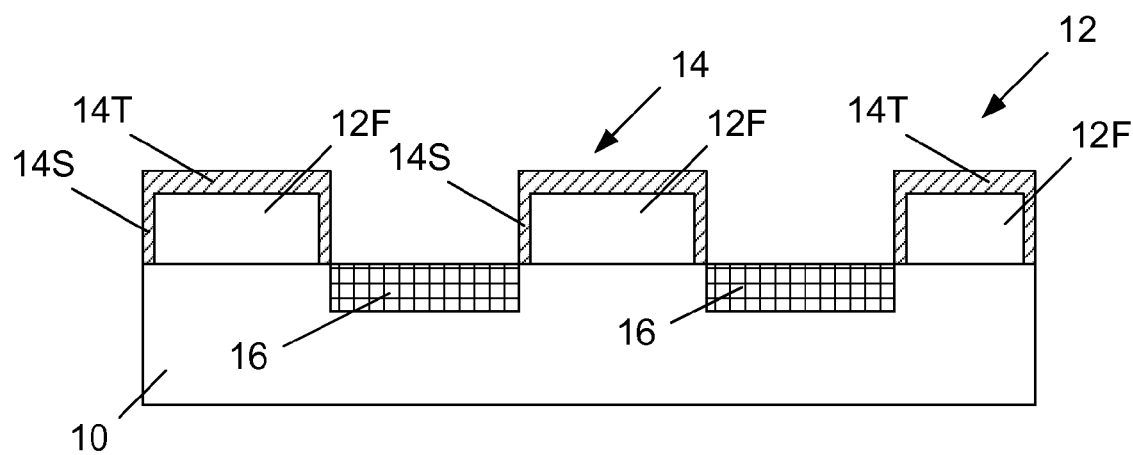
(Prior Art) Figure 1B
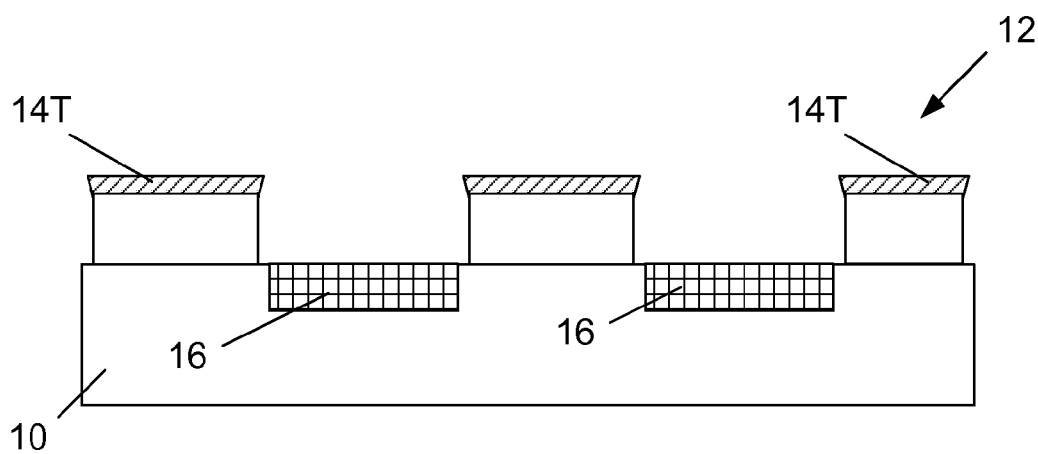
(Prior Art) Figure 1C

RETICLES FOR USE IN FORMING IMPLANT MASKING LAYERS AND METHODS OF FORMING IMPLANT MASKING LAYERS

CROSS-REFERENCE TO RELATED APPLICATION

This is a divisional of co-pending application Ser. No. 13/560,012, filed Jul. 27, 2012.

BACKGROUND OF THE INVENTION

1. Field of the Invention

Generally, the present disclosure relates to the manufacture of sophisticated semiconductor devices, and, more specifically, to reticles that are employed in photolithography systems to form patterned mask layers for use in ion implantation processes, and to the use of such reticles in performing any of a variety of ion implantation processes that are routinely performed in semiconductor manufacturing operations.

2. Description of the Related Art

The fabrication of advanced integrated circuits, such as CPU's, storage devices, ASIC's (application specific integrated circuits) and the like, requires the formation of a large number of circuit elements, such as a transistor, in a given chip area or die according to a specified circuit layout. In general, integrated circuit devices are formed by performing a number of process operations in a detailed sequence or process flow. Such process operations typically include deposition, etching, ion implantation, photolithography and heating processes that are performed in a very detailed sequence to produce the final integrated circuit device. These processes are continued until such time as the integrated circuit device is complete.

A typical photolithography process generally involves the steps of: (1) applying a layer of photoresist above a wafer, typically accomplished by a spin-coating process; (2) pre-baking (or soft-baking) the layer of photoresist at a temperature of approximately 90-120° C. to reduce the level of solvents in the layer of photoresist and to improve the adhesion characteristics of the photoresist; (3) performing an exposure process, wherein a pattern on a reticle is projected onto the layer of photoresist used in a stepper tool to create a latent image in the layer of photoresist; (4) performing a post-exposure bake on the layer of photoresist at a temperature approximately 5-15° C. higher than the pre-bake process; (5) performing a develop process to turn the latent image in the layer of photoresist into the final resist image; and (6) performing a post-bake process (or hard-bake) at a temperature of approximately 125-160° C. to remove residual solids and to improve adhesion of the patterned photoresist mask. These process steps are well known to those skilled in the art and, thus, will not be described herein in any greater detail.

Photolithography tools and systems typically include a source of radiation at a desired wavelength, an optical system and, typically, the use of a so-called mask or reticle that contains a pattern that is desired to be formed on a wafer. Radiation is provided through or reflected off the mask or reticle to form an image on a semiconductor wafer. The radiation used in such systems can be light, such as ultraviolet light, deep ultraviolet light (DUV), vacuum ultraviolet light (VUV), extreme ultraviolet light (EUV), etc. The radiation can also be x-ray radiation, e-beam radiation, etc. Generally, the image on the reticle is utilized to irradiate a light-sensitive layer of material, such as photoresist material. Ultimately, the irradiated layer of photoresist material is developed to define a patterned mask layer using known techniques. Ultimately, the patterned mask layer can be utilized to define doping regions, deposition regions, etching regions or other structures associated with an integrated circuit. Currently, most of the photolithography systems employed in semiconductor manufacturing operations are so-called deep ultraviolet systems (DUV) that generate radiation at a wavelength of 248 nm or 193 nm. However, the capabilities and limits of traditional DUV photolithography systems are being tested as device dimensions continue to shrink. This has led to the development of a so-called EUV system that uses radiation with a wavelength less than 20 nm, e.g., 13.5 nm.

In one example, photolithography tools and techniques may be employed to form a patterned implant mask layer comprised of a photoresist material above a semiconducting substrate or a layer of material. The patterned implant mask exposes portions of the substrate or the layer of material where it is desired to implant various dopant materials. In general, in photolithography operations, the pattern desired to be formed on the underlying layer of material is initially formed on a reticle. Thereafter, using an appropriate stepper tool and known photolithographic techniques, the image on the reticle is transferred to the layer of photoresist. Then, the layer of photoresist is "developed" so as to leave in place a patterned layer of photoresist substantially corresponding to the pattern on the reticle. This patterned layer of photoresist is then used as a mask in subsequent ion implant processes. The patterned layer of photoresist is comprised of a plurality of features, e.g., line-type features or opening-type features, that are to be replicated in an underlying process layer.

With reference to FIGS. 1A-1D, one illustrative prior art technique for removing an ion implant mask will be discussed. As shown in FIG. 1A, a patterned implant mask 12 is formed above a substrate 10. A plurality of illustrative features 12F, e.g., line-type features, are defined in the patterned implant mask 12. The patterned implant mask 12 may be formed using traditional photolithography tools and techniques. The implant mask 12 covers portions of the substrate 10 while leaving other portions of the substrate 10 exposed.

FIG. 1B depicts the device after an ion implantation process has been performed to introduce dopant materials, e.g., N-type or P-type dopant materials, into the substrate 10 and thereby form illustrative doped regions 16. The implanted dopant materials typically define doped regions, such as N-wells, P-wells, halo regions, source/drain regions, etc., and the implant process may be performed at a near vertical implant angle or it may be a tilted implant process, depending on the particular application.

With continuing reference to FIG. 1B, the implant process results in the formation of a relatively hard "crust" layer 14 on the features 12F of the patterned implant mask 12. The crust layer 14T on the top of the features 12F of the implant mask 12 is typically thicker than the crust layer 14S on the sidewalls of the features 12F of the implant mask 12. For example, in some applications, the side crust layer 14S may be approximately one-half of the thickness of the top crust layer 14T.

Obviously, after the desired dopants are implanted into the substrate 10 through the patterned implant mask 12, the implant mask 12 must be removed. Removal of such an implant mask can be time consuming and problematic in many respects. One illustrative prior art process for removing such an implant mask 12 involves performing a brief plasma ashing process followed by performing a wet etching process. More specifically, a brief, e.g., approximately 30 seconds, plasma ashing process is performed to "break through" the relatively thinner side crust layer 14S. FIG. 1C depicts the patterned mask layer 12 after this plasma ashing process has been performed. Thereafter, as shown in FIG. 1D, an etching process using, for example, a sulfuric acid/peroxide mixture is performed to effectively attack the now-exposed resist material and "lift" the remaining portions of the patterned implant mask layer 12, including the top crust layer 14T. Attempts to remove the entirety of the crust layer 14T by extending the duration of the plasma ashing process have been unsuccessful. More specifically, even in cases where the plasma ashing process has been performed for an extended duration, e.g., about 10 minutes or so, the net result has been the formation of an undesirable Teflon-like material on the surface of the substrate 10, which cannot be easily removed by subsequent etching or cleaning processes using, for example, a sulfuric acid/peroxide mixture.

Another problem associated with implant masks and their removal will now be discussed with reference to FIG. 2A. FIG. 2A depicts an illustrative semiconductor substrate 20, e.g., a silicon wafer with a plurality of functional die 22 and incomplete die 24 formed above the substrate 20. It varies depending upon the particular application, but 200-400 individual die may be formed on a typical wafer. The incomplete die 24 are incomplete in the sense that the edge 20E of the substrate 20 passes through the incomplete die 24. Typically, the same process operations are performed on the incomplete die 24 as are performed on the functional die 22, e.g., gate structures are formed on both the incomplete die 24 and on the functional die 22, in an effort to insure processing uniformity across the wafer 20.

To form a patterned implant mask above the substrate 20, the substrate 20 is initially coated with a resist material (not shown) and thereafter, as noted above, portions of the resist material are irradiated with a light source to change the chemical characteristics of the resist material. In modern semiconductor manufacturing operations, the exposure process is performed in sophisticated photolithography tools referred to as "steppers." In such a stepper tool, light is directed through or off of a reticle to transfer the pattern on the reticle to the layer of photoresist material. Each "flash" in the stepper exposes a set number of die on the wafer. The number of die exposed in any particular "flash field" may vary depending upon the particular application. For example, steppers may employ a "2×2" flash field, a "2×3" flash field, etc. In a 2×2 flash field, four die are exposed in each "flash" in the stepper. The stepper exposes the entire layer of photoresist on a flash-by-flash basis. That is, after the first flash is performed to expose four die, the wafer is moved relative to the light source, and a second flash is performed to expose another four die. This process is performed until such time as the entire layer of photoresist is exposed. Thereafter, the "exposed" layer of photoresist is "developed" to remove the exposed portions of the photoresist material. The developed layer of photoresist is then subjected to the "hard bake" heating process mentioned above to complete the formation of the patterned implant mask layer 12.

With reference to FIG. 2A, illustrative 2×2 flash fields 26 are depicted. As mentioned above, even the photoresist material above the incomplete die 24 is exposed and developed. Focusing on a single die, a typical implant mask covers a very large percentage of the underlying die. Stated another way, very little of the underlying die is exposed in a typical implant mask. For example, in a typical implant mask, perhaps as little as 1-5% of the underlying die is exposed. Moreover, the portions of a typical patterned implant mask that are positioned above the incomplete die 24 represents unnecessary resist material that must eventually be removed, such as by performing the plasma ashing/wet etching process described above.

FIG. 2B depicts an illustrative prior art reticle 30 comprised of a body 31 having a center 32, which will be simultaneously irradiated in a single flash in a stepper tool. In this example, the reticle 30 is comprised of an arrangement of four illustrative patterns 34, each of which will ultimately be transferred to the portion of a layer of photoresist positioned above a single die. In the depicted example, the reticle 30 has an illustrative 2×2 pattern or flash-field, wherein the photoresist material above four individual die will be exposed in a single "flash." The arrangement of the patterns 34 is centered relative to the center 32 of the body of the reticle 30.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to reticles that are employed in photolithography systems to form patterned mask layers for use in ion implantation processes, and to the use of such reticles in performing any of a variety of ion implantation processes that are routinely performed in semiconductor manufacturing operations. In one example, a reticle disclosed herein includes a body having a center, an arrangement of a plurality of exposure patterns, wherein a center of the arrangement is offset from the center of the body and at least one open feature defined on or through the body of the reticle.

In another illustrative example, a reticle that is adapted for use in exposing photoresist during a photolithography exposure process is disclosed. The reticle includes a body, and the body includes, among other things, a plurality of exposure patterns, each of the plurality of exposure patterns being adapted to expose a pattern in a portion of the photoresist material formed above a functional die of the semiconducting substrate. The body further includes at least one open feature that is adapted to expose substantially an entirety of a portion of the photoresist material formed above an incomplete die of the semiconducting substrate, wherein an edge of the semiconducting substrate passes through the incomplete die.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art process flow for removing a patterned ion implantation mask layer;

Figure 1D:
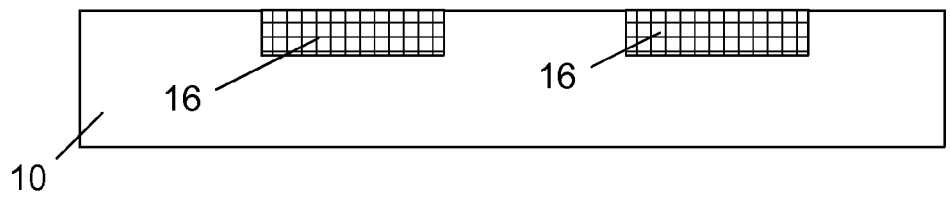
Figure 2A:
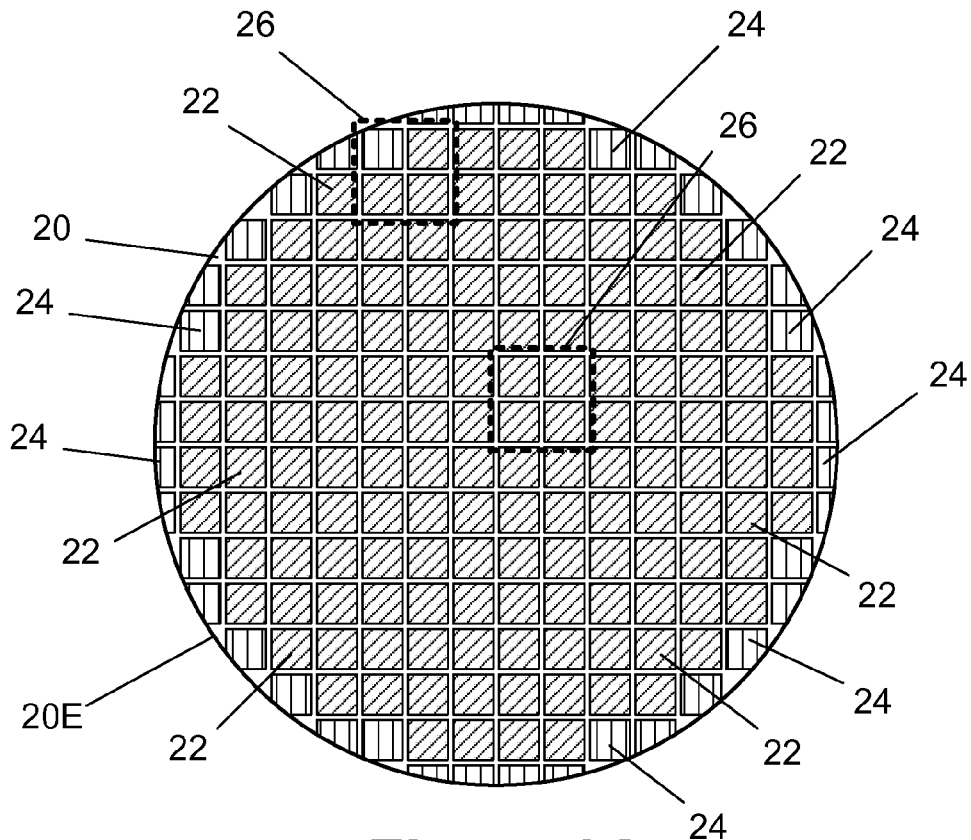
FIG. 2A is a plan view of an illustrative prior art substrate comprised of a plurality of functional die and a plurality of incomplete die.
Figure 2B:
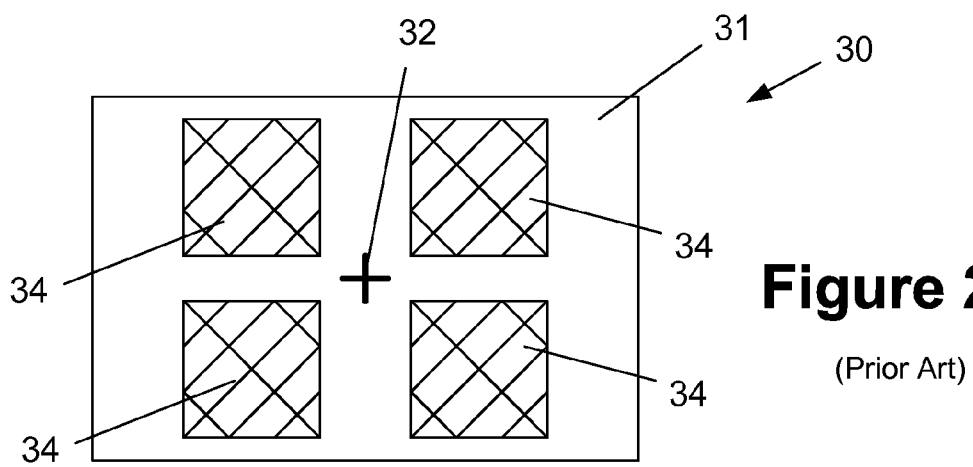
FIG. 2B depicts one illustrative embodiment of a prior art reticle that is employed in photolithography tools.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to reticles that are employed in photolithography systems to form patterned mask layers for use in ion implantation processes, and to the use of such reticles in performing any of a variety of ion implantation processes that are routinely performed in semiconductor manufacturing operations. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Generally, the present invention is directed to an ion implant system that employs a novel reticle that facilitates exposure and removal of photoresist material above incomplete die as part of the photoresist exposure/development process. Using the devices and method disclosed herein, relatively large amounts of undesirable photoresist material may be removed during the photoresist exposure/development process, thereby eliminating this material as part of a patterned implant mask. As a result, removal of the implant mask after one or more ion implant processes have been performed through the implant mask may be easier and may result in less chance of particle formation as compared to prior art implant masks.

Figure 3:
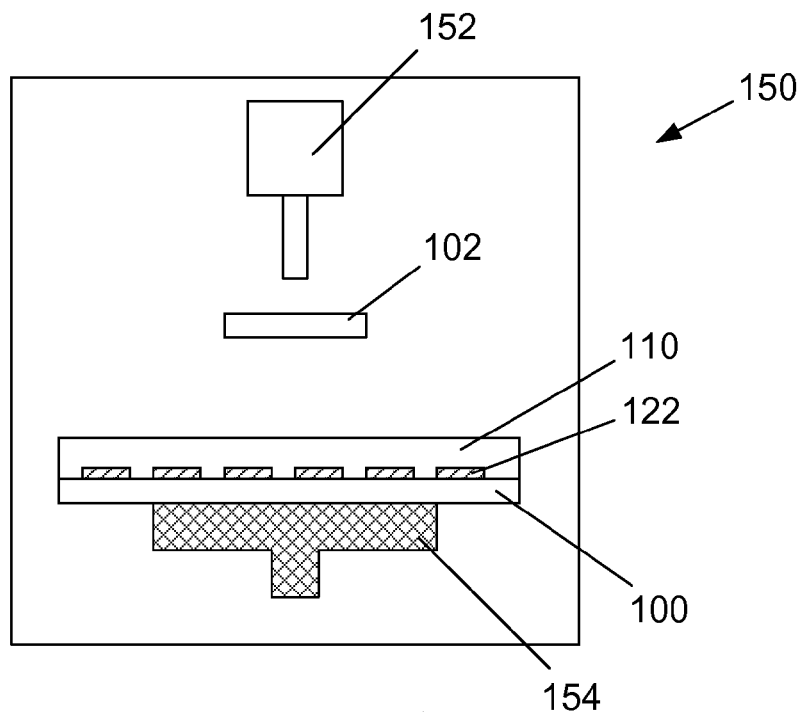
FIG. 3 is a schematic depiction of an illustrative embodiment of a photolithography system that may be employed with the reticles and methods disclosed herein.
Figure 4:
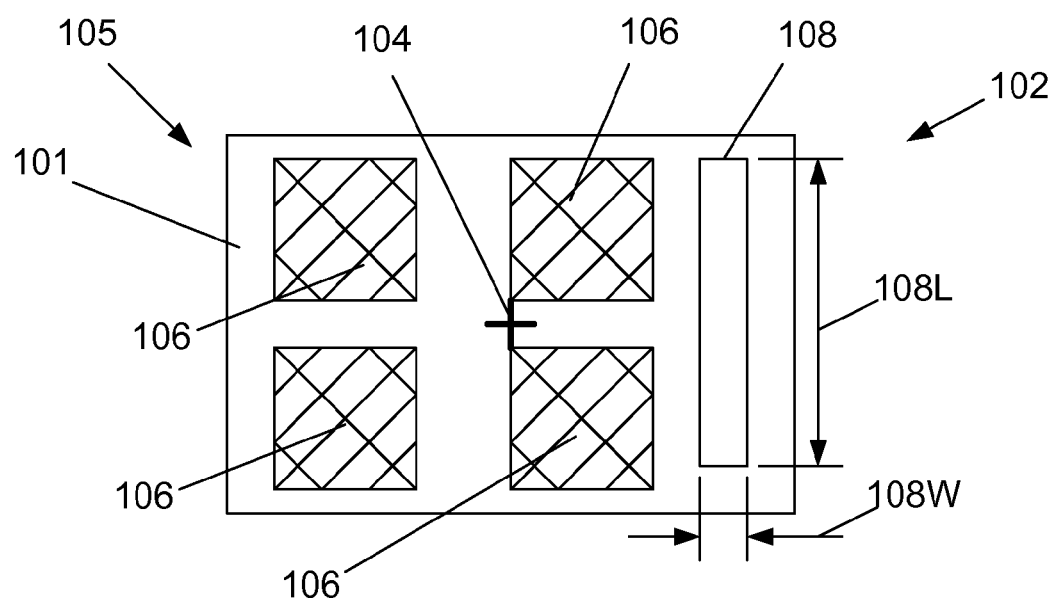
FIG. 4 is a schematic depiction of one illustrative embodiment of a novel reticle disclosed herein.

FIG. 3 depicts a schematic and simplistic view of an illustrative photolithography exposure tool 150 disclosed herein. FIG. 4 depicts one illustrative embodiment of a novel reticle 102 disclosed herein that may be employed in the exposure tool 150. As shown in FIG. 3, the exposure tool 150 is generally comprised of a light source 152 and a wafer stage 154. An illustrative semiconducting substrate 100 is positioned on the wafer stage 154 and a layer of photoresist material 110 is formed above the substrate 100. A plurality of illustrative functional die 122 are also depicted.

As shown in FIG. 4, the reticle 102 is comprised of a body 101, an illustrative arrangement 105 of patterns 106 and one illustrative open feature 108. In the depicted example, the reticle 102 employs a 2×2 arrangement 105 wherein each of the patterns 106 will be transferred to a portion of the layer of photoresist material 110 positioned above a single die. Of course, as mentioned previously, the number of patterns 106 on the reticle 102 may vary, e.g., the reticle may employ a 2×3 arrangement 105. Thus, the number of die exposed by use of the novel reticle 102 disclosed herein may vary depending on the particular application and, accordingly, the inventions disclosed herein should not be considered as limited to the number of patterns on the reticle 102.

Importantly, the arrangement 105 of the patterns 106 is intentionally positioned off-center as it relates to the center 104 of the reticle 102. That is, the arrangement 105 of the patterns 106 is intentionally positioned asymmetrically with respect to the center 104 of the reticle 102. Asymmetric positioning of the arrangement 105 of the patterns 106 allows room on the reticle 102 for the placement of the illustrative open feature 108 on the reticle 102. The open feature 108 may be of any desired shape, configuration or size and it may be oriented in any direction on the reticle 102. In one illustrative example, the open feature 108 may have a width 108W that corresponds to the width of one of the die 122 and a length 108L that corresponds to the combined overall length of two adjacent die 122. In other applications, the width of the open feature 108 may be less than the width of the die 122, e.g., the width 108W may be about one-half of a die 122. In some cases, the open feature 108 may have a length and width that corresponds approximately to the length and width of a single individual die 122. In other cases, such as when the arrangement 105 is a 2×3 arrangement, the width 108W of the open feature 108 may correspond approximately to the width of an individual die 122, while the length 108L may correspond with the combined length of three adjacent die 122. Moreover, if desired and if there is sufficient room on the reticle 102, more than one open feature 108 may be formed on a single reticle 102. Thus, the number, size, configuration, orientation and shape of the open feature 108 on the reticle 102 disclosed herein should not be considered to be a limitation of the present invention.

In general, using the reticle 102 and exposure system 150 disclosed herein, the light from the light source 152 may be used to transfer the patterns 106 on the reticle 102 to portions of the photoresist material 110 positioned above four illustrative die in a single flash. Additionally, the reticle 102 disclosed herein may be employed to expose substantially the entire portion of photoresist material 110 positioned above incomplete dies. That is, light from the light source 152 may be directed through the open feature 108 to expose the portions of the photoresist material 110 positioned above one or more incomplete die 124 (depending upon the size and configuration of the open feature 108), to thereby enable removal of the photoresist material 110 from above the incomplete die 124 using photoresist exposure/development techniques.

Figure 5A:
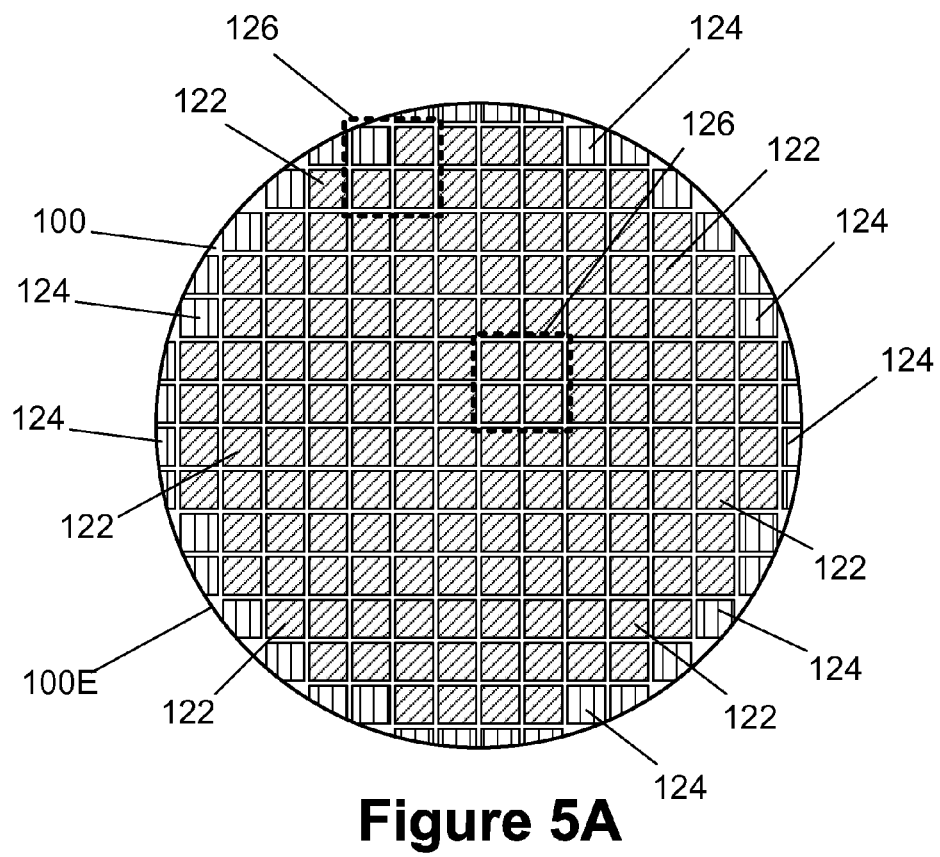
FIGS. 5A-5D depict one illustrative method disclosed herein for removing photoresist material positioned above a plurality of incomplete die that are formed above a substrate.
Figure 5B:
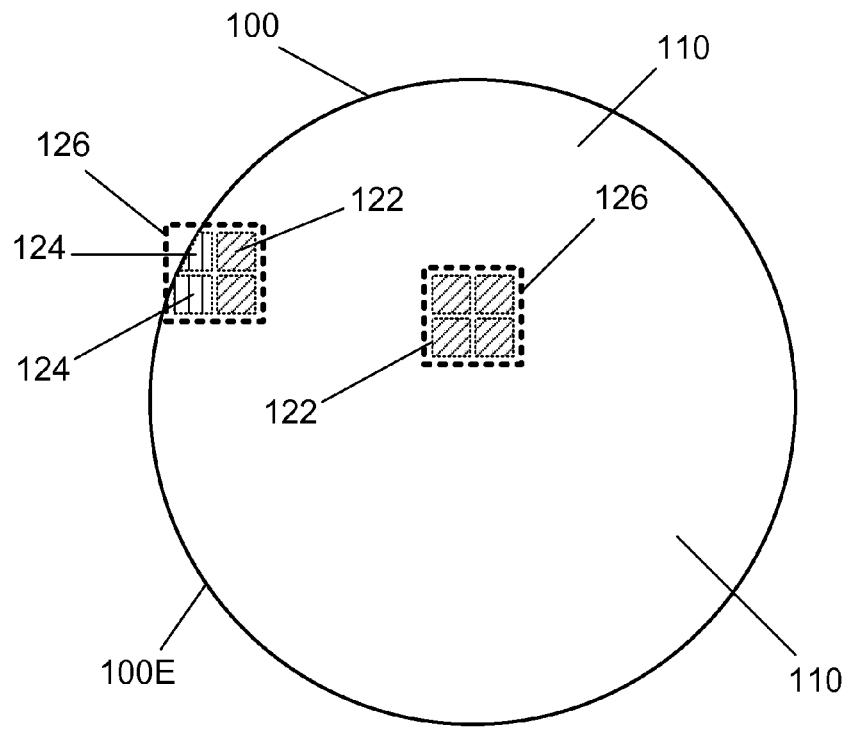

FIGS. 5A-5D depict one illustrative technique that may be employed using the reticle 102 disclosed herein. As shown in FIG. 5A, a plurality of functional die 122 and incomplete die 124 are formed above the substrate 100 having an edge 100E. The number, size and shape of the functional die 122 and incomplete die 124 may vary depending upon the particular application, and thus such factors should not be considered to be a limitation of the present invention. In one example, as shown in FIG. 5B, the layer of photoresist material 110 is formed above all of the functional die 122 and all of the incomplete die 124. In this embodiment, multiple pattern transfer exposure processes are performed on the layer of photoresist 110, on a flash-by-flash basis, until such time as the patterns 106 have been transferred to the entire layer of photoresist 110. That is, the layer of photoresist is initially exposed through the arrangement 105 of patterns 106 on the reticle 102, i.e., the patterns 106 are transferred to the entire layer of photoresist 110. FIG. 5B is a depiction of the layer of photoresist material showing two illustrative flash fields 126 that are exposed using the reticle 102. One of the flash fields 126 is depicted in the interior of the substrate 100, whereby the flash field encompasses four functional die, and one of the flash fields 126 is depicted near the edge 100E of the substrate 100, whereby the flash field encompasses three functional die 122 and one incomplete die 124.

Figure 5C:
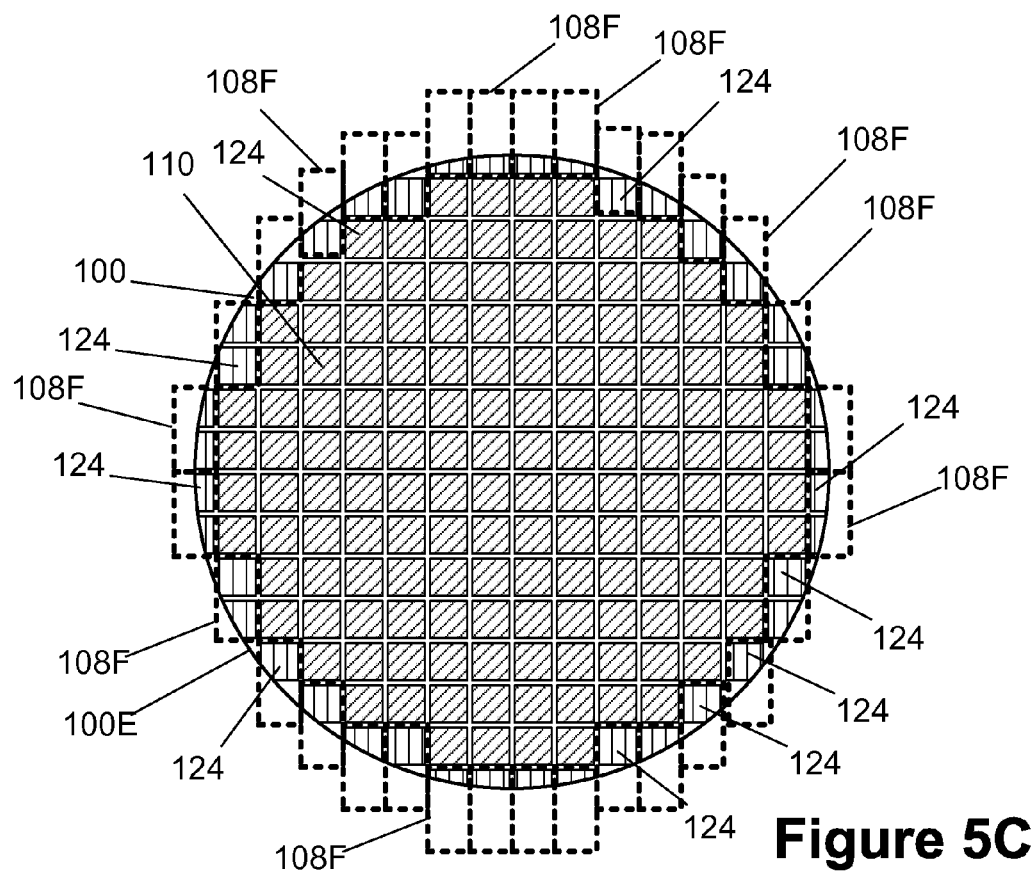
Figure 5D:
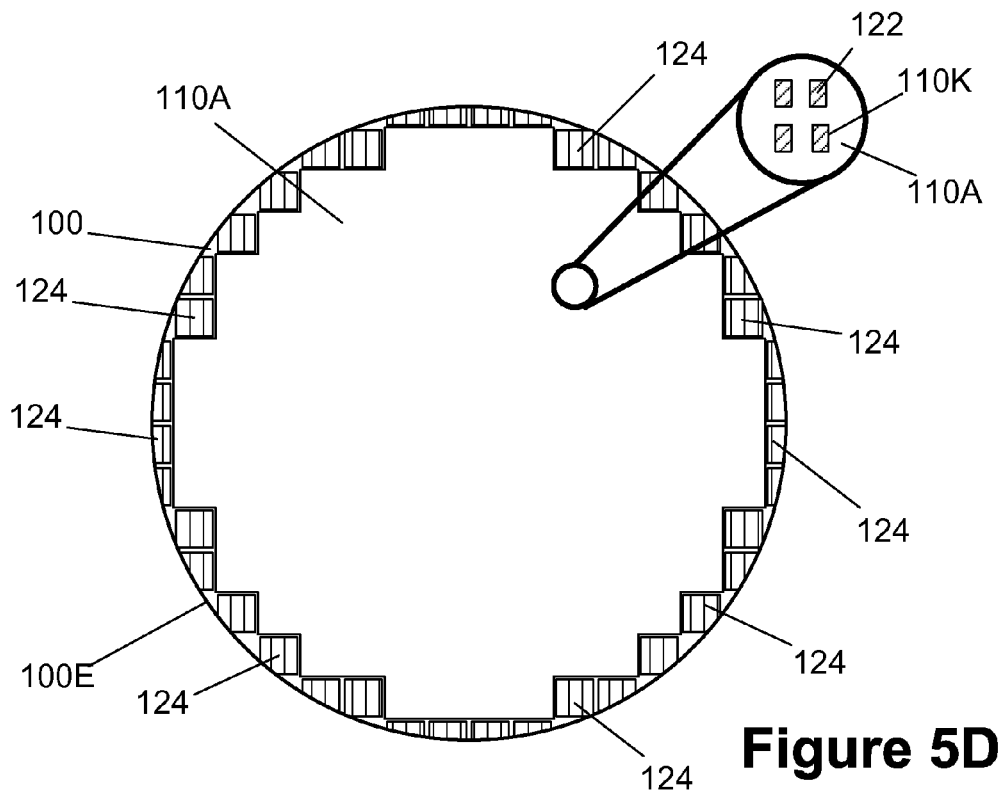

Thereafter, prior to performing any photoresist development activities, as shown in FIG. 5C-5D, the portions of the photoresist material 110 positioned above the entirety of all of the incomplete die 124 may be exposed, flash-by-flash through the open feature 108 on the reticle 102 by performing multiple incomplete die exposure processes, as reflected by the multiple dashed-line flash fields 108F in FIG. 5C. FIG. 5D depicts the layer of photoresist 110A after it has been developed to thereby define a patterned mask layer comprised of a plurality of openings 110K that expose portions of the underlying functional die 122 for further processing. Note that, due to the exposure of the photoresist material 110 through the open feature 108 on the reticle 102, a significant portion of the photoresist material 110 may be removed using traditional photoresist development processes, a much more efficient and effective removal technique than the two step ashing/etching process described in the background section of this application. Moreover, removal of the photoresist material 110 positioned above the incomplete die 124 may result in reducing the total number of exposure shots that are required to fully expose the layer of photoresist above the functional die 122.

In another embodiment, when the flash field 126 encompasses both functional die 122 and at least one incomplete die 124, a first pattern transfer exposure process may be performed to transfer the arrangement 105 of patterns 106 to the photoresist material 110 above all of the functional die 122 and the incomplete die 124. Thereafter, a second incomplete die exposure process may be performed through the open feature 108 to completely expose the photoresist material 110 above the incomplete die 124 within the previously exposed flash field 126. As yet another alternative, the exposure of the photoresist material 110 above the incomplete die 124 may be performed prior to performing the pattern transfer exposure processes on the layer of photoresist positioned above the die (functional and/or incomplete die) within the flash field 126 through the arrangement 105 of patterns 106. As noted previously, in all cases, the pattern transfer exposures processes and the incomplete die exposure processes will be performed on the layer of photoresist prior to performing development activities, e.g., photoresist rinse and hard bake.

The patterned ion implant mask 110A may then be employed when implanting dopant material into a semiconducting substrate using known ion implantation tools and techniques. As noted previously, by removing significant portions of the patterned implant mask 110A by photoresist exposure and development techniques, e.g., by exposing the portions of the photoresist material positioned above the incomplete die 124, the problems encountered in removing implant mask layers after the ion implant process has been performed, as discussed in the background section of this application, may be reduced.

As will be appreciated by those skilled in the art after a complete reading of the present application, the methodologies and principles disclosed herein may be employed with exposure systems using any desired wavelength, e.g., DUV and/or EUV systems. In DUV systems, light from the light source of the DUV system passes through the patterns 106 in the reticle 102. In an EUV system, light from the light source of the EUV is reflected off of the reticle. Nevertheless, a reticle for an EUV system would be based on the same principles discussed above. Namely, the arrangement 105 of the patterns 106 would still be positioned off center of the reticle and the "open" region would be defined on the EUV reticle. Thereafter, the same processes described above may be performed to pattern a layer of photoresist using the EUV system, wherein light is reflected off of the reticle. Thus, when it is stated in this specification that a reticle has a body wherein there is "at least one open feature defined on or through the body" of the reticle, such language should be understood to cover a reticle or method for use with light transmission-based exposure systems, such as DUV systems, as well as light-reflecting systems, such as EUV systems.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A reticle, comprising:
   a body having a center;
   an arrangement of a plurality of exposure patterns, wherein a center of said arrangement is offset from said center of said body; and
   at least one open feature defined on or through said body.

2. The reticle of claim 1, wherein said body has a rectangular configuration.

3. The reticle of claim 1, wherein said arrangement comprises four exposure patterns arranged in a 2×2 pattern.

4. The reticle of claim 1, wherein said arrangement comprises six exposure patterns arranged in a 2×3 pattern.

5. The reticle of claim 1, wherein said open feature has one of a rectangular or square configuration.

6. The reticle of claim 1, wherein said reticle is adapted for use in a light-transmission photolithography system and wherein said at least one open feature extends through said body.

7. The reticle of claim 1, wherein said reticle is adapted for use in a light-reflecting EUV photolithography system and wherein said at least one open feature is formed on a surface of said body.

8. The reticle of claim 1, wherein said reticle is adapted for use in exposing a layer of photoresist material positioned above a substrate and said at least one open feature has at least one dimension that is approximately equal to a width of a single functional die of said substrate.

9. The reticle of claim 1, wherein said reticle is adapted for use in exposing a layer of photoresist material positioned above a substrate and said at least one open feature has at least one dimension that is approximately equal to a combined length of two adjacent functional die of said substrate.

10. The reticle of claim 1, wherein said reticle is adapted for use in exposing a layer of photoresist material positioned above a substrate and said at least one open feature is adapted to permit exposure of substantially an entirety of a portion of said layer of photoresist material that is positioned above an incomplete die of said substrate.

11. A reticle that is adapted for use in exposing photoresist material during a photolithography exposure process, the reticle comprising:
   a body, comprising:
      a plurality of exposure patterns, each of said plurality of exposure patterns being adapted to permit exposure of a pattern in a portion of a layer of photoresist material positioned above a functional die of a semiconducting substrate; and
      at least one open feature that is adapted to permit exposure of substantially an entirety of a portion of said layer of photoresist material positioned above an incomplete die of said semiconducting substrate, wherein an edge of said semiconducting substrate passes through said incomplete die.

12. The reticle of claim 11, wherein said plurality of exposure patterns comprises an arrangement of exposure patterns, a center of said arrangement being offset from a center of said body.

13. The reticle of claim 12, wherein said arrangement comprises four exposure patterns arranged in a 2×2 pattern.

14. The reticle of claim 12, wherein said arrangement comprises six exposure patterns arranged in a 2×3 pattern.

15. The reticle of claim 11, wherein said body has a rectangular configuration.

16. The reticle of claim 11, wherein said at least one open feature has one of a rectangular and a square configuration.

17. The reticle of claim 11, wherein said at least one open feature has at least one dimension that is approximately equal to a width of a single functional die of said semiconducting substrate.

18. The reticle of claim 11, wherein said at least one open feature has at least one dimension that is approximately equal to a combined length of two adjacent functional die of said semiconducting substrate.

19. The reticle of claim 11, wherein said reticle is adapted for use in a light-transmission photolithography system and said at least one open feature extends through said body.

20. The reticle of claim 11, wherein said reticle is adapted for use in a light-reflecting EUV photolithography system and said at least one open feature is formed on a surface of said body.

\* \* \* \* \*